United States Patent [19]

Landt

[11] Patent Number: 4,884,077
[45] Date of Patent: Nov. 28, 1989

[54] WEATHER RADAR TEMPERATURE CONTROLLED IMPATT DIODES CIRCUIT AND METHOD OF OPERATION

[75] Inventor: Don L. Landt, Marion, Iowa

[73] Assignee: Rockwell International Corporation, El Segundo, Calif.

[21] Appl. No.: 148,747

[22] Filed: Jan. 27, 1988

[51] Int. Cl.[4] .............................................. H04B 6/66
[52] U.S. Cl. .................................... 342/202; 342/175
[58] Field of Search ............ 331/107 R, 176; 342/26, 342/175, 202; 330/287

[56] References Cited

U.S. PATENT DOCUMENTS

| | | |
|---|---|---|
| 3,831,109 | 8/1974 | Leiby . |
| 4,028,637 | 6/1977 | Gewartowski et al. ......... 331/107 R |
| 4,086,543 | 4/1978 | Nigrin ................................. 330/287 |
| 4,151,488 | 4/1979 | Wallace . |
| 4,306,237 | 12/1981 | Tresselt . |
| 4,333,062 | 6/1982 | Uwano ........................... 331/176 X |
| 4,445,096 | 4/1984 | Lee et al. . |
| 4,492,960 | 1/1985 | Hislop ................................ 342/175 |
| 4,504,718 | 3/1985 | Okatsuka et al. ............... 331/107 R |
| 4,568,891 | 2/1986 | Davies ............................ 331/107 R |

Primary Examiner—Thomas H. Tarcza
Assistant Examiner—Mark Hellner
Attorney, Agent, or Firm—Gregory G. Williams; M. Lee Murrah; H. Fredrick Hamann

[57] ABSTRACT

A method in circuit for controlling the temperature of IMPATT diodes during pulsed operations: first, by providing a switch of the RF energy produced by the IMPATT for switching the IMPATT output from an antenna to an internal load, the switch being a pin diode switch; secondly, switching the output of a pair of IMPATT diodes from an antenna to an internal load by providing a selective phase shifter for shifting the phase of the injection signal to one of the IMPATT diodes and further providing a hybrid coupler at the output ends of the IMPATT diodes and disposed between the antenna and the internal load; thirdly, providing a pair of injection signal sources which operate on different frequencies and alternately switching the separate injection sources with the input end of an RF producing IMPATT diode; and fourthly, providing a positive biased pre-heat current pulse to the RF producing IMPATT.

2 Claims, 2 Drawing Sheets

WEATHER RADAR TEMPERATURE CONTROLLED IMPATT DIODES CIRCUIT AND METHOD OF OPERATION

CROSS-REFERENCE

This application is related to the subject matter of co-pending application entitled "Compact Low Resonant Frequency Pulsed Power Source at Microwave Frequencies" by Robert J. Weber, filed on July 14, 1987, and assigned to the same assignee, the serial number of which is No. 073,044, which application is hereby incorporated herein by this reference.

BACKGROUND OF THE INVENTION

The present invention generally relates to IMPATT diodes and more particularly relates to improved techniques and circuits for controlling the temperature of IMPATT diodes during pulsed operations, and even more particularly relates to techniques for providing essentially constant pulsed power output from an IMPATT diode or diodes when operated over a wide range of temperatures.

In today's aviation industry, it is common for a single aircraft to be subjected to several extreme thermal conditions in a relatively short time interval. It it not uncommon for an aircraft to be flying at an altitude of 40,000 feet with an outside temperature of less than $-55°$ C., while only moments earlier it was waiting for a take-off clearance from a hot, humid airport runway. With the current aspirations for trans-atmospheric aircraft, these extreme viscissitudes in the ambient temperature will continue to confront avionics engineers with perplexing problems of increasing difficulty and importance.

One particular problem that is exacerbated by these temperature oscillations is the control of the junction temperature of IMPATT diodes used to generate microwave power in the GHz frequency range. Impact ionization avalanche transit time (IMPATT) diodes have many uses, but they are best known for their abilities to produce negative resistances and act as reliable solid-state sources of power at microwave frequencies. A similarity in all IMPATT diodes is the fact that the contain at least a single junction between a P-type semiconductor and an N-type semiconductor. A brief description of the operation, construction, and function of IMPATT diodes is given in Size, *Semiconductor Devices, Physics and Technology*, published in 1985 by John Wiley and Sons, New York, NY, in chapter 6.2 at pages 229-234 (inclusive), which is hereby incorporated herein by this reference.

The power output, efficiency, and operating impedance of IMPATT diodes, which are used to generate microwave power, depend critically upon their instantaneous junction temperature. One example of the use of IMPATT diodes which creates a difficult junction temperature control situation is in airborne weather radar. In such applications, the IMPATT diodes are operated in a pulsed manner, thereby causing a fluctuation of the junction temperature. For example, diodes which are tuned at room temperature for a 30 usec pulse width, typically tend to lose approximately 1 to 2 db of average pulse power when operated at $+85°$ C. and greater than roughly 3.0 db of pulse power at $-55°$ C. Due to the junction heating, the slope of power output versus time plot across the pulse often becomes much steeper at low temperatures and can result in a power output change of greater than approximately 6.0 db for short pulses of 6.0 usecs of less. Efficiencies of roughly 20% at room temperature often can drop to less than 5% at $-55°$ C.

Several alternative techniques have been developed and implemented in the past to attempt to overcome these temperature variations. One method which has been used is, to place the chassis containing the IMPATT diodes in a controlled temperature environment. Some type of electrical heater or cooler, or both, is then implemented to maintain the IMPATT diodes in an optimum temperature range. Another method for maintaining IMPATT performance over temperature deals with an electronic preheat. This technique heats the diodes with a low magnitude, pulsed, reversed-biased avalanche current prior to the main pulse. The pulse is typically between 10 and 100 usec's in width, and usually less than 100 milliamps in magnitude for each diode. This technique has been employed in some existing avionics weather radars.

While these techniques, or variations of them, have been used for controlling the temperature of IMPATT diodes during pulsed operations, the do have numerous and serious drawbacks. One major problem with the environment temperature control method is that it often results in low heating efficiency and even lower cooling efficiency of the large chassis: The typical thermal time constant of several minutes associated with bringing the IMPATT devices up to operating temperature, the moisture condensation and evaporation due to maintaining the IMPATT chassis at some temperature different from the ambient, and the size and bulk of the heaters, coolers and associated cables necessary to implement such a temperature control method are further problems.

A major downfall of the second technique is that the magnitude of the preheat current is not great enough to produce significant junction heating at very cold temperatures. Typically a current of five to ten times larger would be required to produce the desired heating. Any attempts, however, to increase the preheat current may produce free-running or locked oscillations from the diode which might be transmitted into space via the antenna. This is undesirable for short ranges (with short pulses) due to the loss of distance resolution and is undesirable for long ranges (with long pulses) due to the loss of storm feature resolution. Increasing the width of the preheat pulse is ineffective due to the typical 100 usec thermal time constant of the typical IMPATT chip.

Consequently, a need exists for improvement in techniques and circuits for controlling the junction temperature of IMPATT diodes using a pulse operation to generate microwave power which are utilized in a wide range of ambient temperatures.

SUMMARY OF THE INVENTION

It is an object of the present invention to provide a near uniform IMPATT diode junction temperature during pulsed operations over a range of ambient temperatures.

It is a feature of the present invention to use a high current, low voltage preheating pulse.

It is an advantage of the present invention to provide sufficient heat to the junction when operated in very cold environments.

It is another object of the present invention to minimize the IMPATT diode junction temperature changes resulting from pulses operations.

It is another feature of the present invention to provide a switch coupled to the output of an IMPATT diode.

It is another advantage of the present invention to provide an IMPATT diode having a continuous output with alternate paths available for the RF energy output.

The present invention provides several techniques for maintaining junction temperature in IMPATT diodes which are designed to satisfy the aforementioned needs, produce the previously propounded object, include the above-described feature, and achieve the disclosed advantage. An "environment control-less" technique is used in the sense that the IMPATT junction temperature is controlled without controlling the temperature of the environment in which is operates. Instead, methods which are completely localized within the IMPATT diode are utilized by providing heating pulses between the RF-producing pulses.

Accordingly, the present invention relates to apparatus and method for maintaining IMPATT junction temperatures for use in pulse operations in a wide range of environments which includes providing a current through the diode between the RF-producing pulses.

BRIEF DESCRIPTION OF THE DRAWINGS

The invention will be best understood by a reading of the description in conjunction with the drawings, in which.

DETAILED DESCRIPTION

Figure 1:
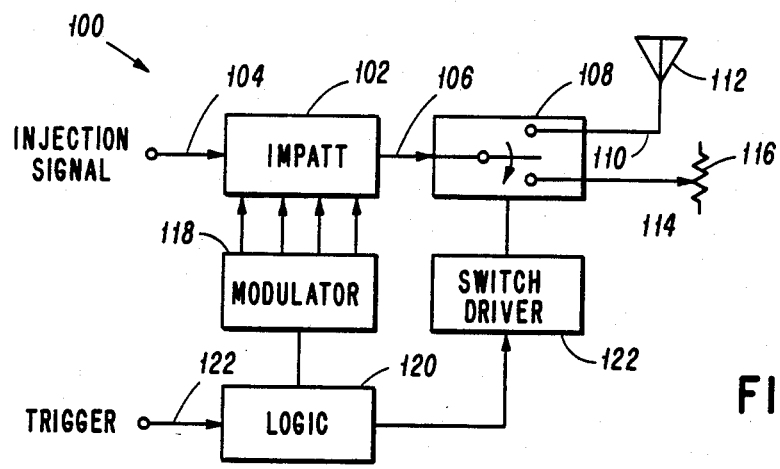
FIG. 1 is a schematic representation of a preferred embodiment of the invention which utilizes a fast high power PIN diode switch.

Referring now to the drawings, and more particularly to FIG. 1, there is shown an IMPATT RF transmitter system generally designated 100, for generating RF signals in a pulsed operation. System 100 contains an IMPATT diode 102 used for producing an RF signal. Diode 102 may be chosen from the many which are commercially available depending upon the particular design criteria for a particular use. Diode 102 typically has a lead 104 for receiving an injection signal and a lead 106, which is now in connection with switch 108 which has leads 110 extending to an antenna 112 and leads 114 extending to a resistive load 116. Lead 110 is utilized to carry the RF signal from the IMPATT diode 102 to the antenna 112. The system 100 further has a modulator 118 coupled to and controlling IMPATT diode 102 for controlling the RF signal output through lead 106. Modulator 118 may be any apparatus which is capable of regulating the output of an IMPATT diode. System 100 further having a logic circuit 120 for receiving a transmitter trigger signal through lead 122 and controlling modulator 118 and coupled switch driver 124, which is coupled to and controlling the PIN diode switch 108. Driver 122 is preferably a FET switch but any suitable driver may be substituted. Switch 108 is preferably a PIN diode switch but a suitable FET switch could also be substituted. Logic circuit 120 is of a variable design depending upon the particular system requirements.

In operation, an injection signal 104 is input into the IMPATT diode 102 and regulated by the modulator 118 in conjunction with the logic circuit 120 receiving the transmitter trigger signals through lead 122. The pulsed RF signal produced by the IMPATT diode 102 is carried by lead 106 to the PIN diode switch 108 where switching can take place. When the RF signal is desired, the PIN switch 108 is switched so that lead 110 can carry the RF signal from lead 106 to antenna 112. When no RF signal output is desired, the switch 108 is configured to carry the signal from lead 106 to load 116. The switching done by the PIN diode switch 108 is controlled through the coupled switch driver 122 and the logic circuit 120.

Figure 2:
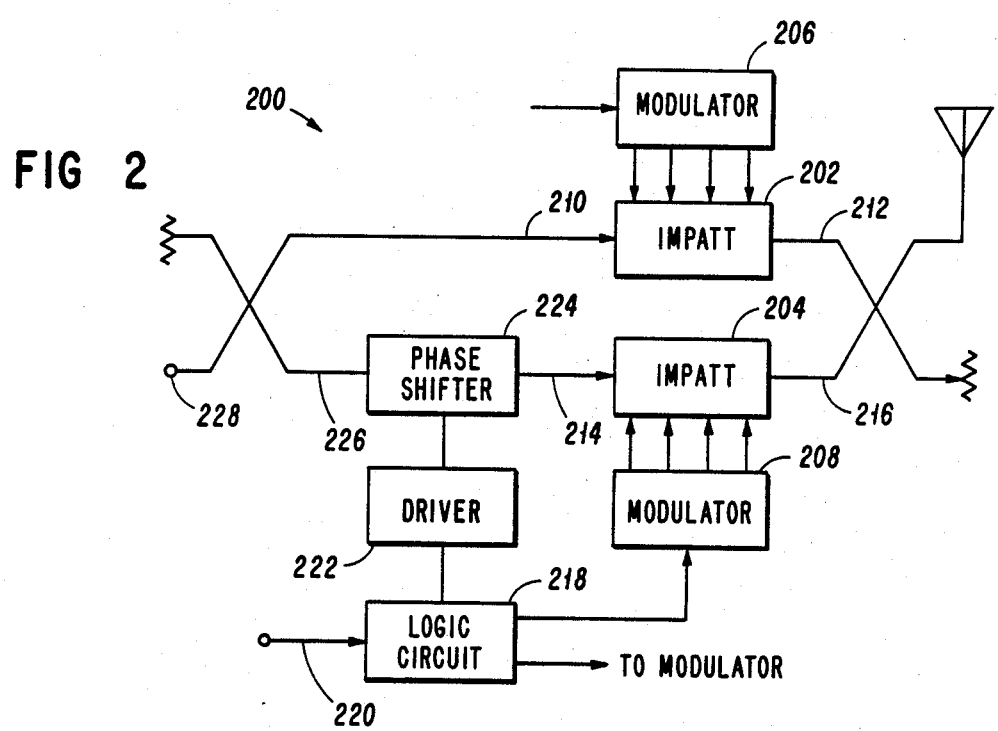
FIG. 2 is a schematic representation of a preferred embodiment of the invention which utilizes two IMPATT chains combined at their outputs using a hybrid coupler.

Now referring to FIG. 2, there is shown a pulsed RF signal system, generally designated 200, having a first IMPATT diode 202 and a second IMPATT diode 204, which are in cooperation with modulators 206 and 208, respectively, all of which are similar to those discussed above. IMPATT diode 202 having an input lead 210 for receiving an injection signal and an output lead 212. IMPATT diode 204 having an input lead 214 and an output lead 216. Leads 212 and 216 are coupled to the antenna and load by a hybrid coupler, preferably a 3.0 db hybrid coupler. Logic circuit 218 receives a trigger signal through lead 220 and regulates both modulator 206 and modulator 208. Logic circuit 218 further controlling driver 222 which connects the phase shifter 224 and through lead 214 into IMPATT diode 204. The phase shifter 224 is preferably a 0° to 180° phase shifter having an input lead 226 for receiving an injection signal from the injection signal input 228.

In operation, the combined output of IMPATT's 202 and 204 can be selectively alternated from the antenna to the internal resistive load by utilizing the hybrid coupler disposed between the IMPATT diodes and the antenna end load and selectively driving the 0° to 180° phase shifter so that the phases of the putouts of IMPATT's 202 and 204 are selectively shifted at output lines 212 and 216 respectively.

Figure 3:
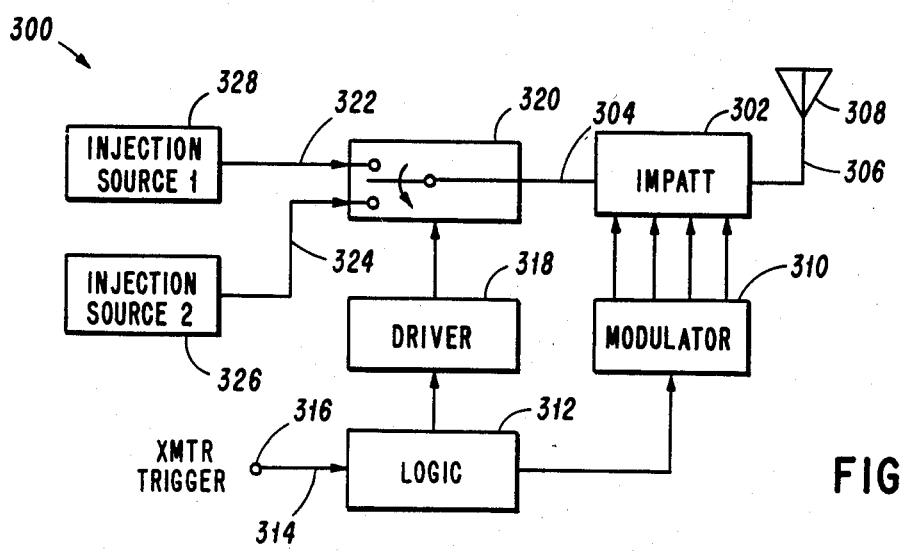
FIG. 3 is a schematic representation of a preferred embodiment of the present invention for use in a coherent, narrow band IF system which utilizes a plurality of injection sources operating at different frequencies'

Now referring to FIG. 3, there is shown an RF pulse producing system, generally designated 300, having an IMPATT diode 302 with an input lead 304 and an output lead 206, which is coupled with an antenna 308. IMPATT diode 302 is regulated by modulator 310 which is controlled by logic circuit 312 having an input lead 314 to transmission trigger 316. Logic circuit 312 further controlling a driver 318 which drives a low power PIN diode switch 320 having a first input lead 322 coupled to a first injection source 328 and a second input lead 324 coupled to a second injection source 326 and further having an output coupled to lead 304.

In operation, a coherent, narrow band IF system was implemented in a switched frequency system where the preheat RF is transmitted out of the antenna at a first frequency $F_1$ while the main burst is transmitted at a second Frequency $F_2$. The difference $F_1-F_2$ is small, preferably on the order of 3.0 to 10.0 MHZ, so that both the frequencies are compatible with the IMPATT transmitter locking bandwidth. The power transmitted at $F_1$ is lost into space with only the power transmitted at $F_2$ received into the narrow band IF, thereby providing a pulsed transmission with preheat to control the IMPATT temperature.

Figure 4:
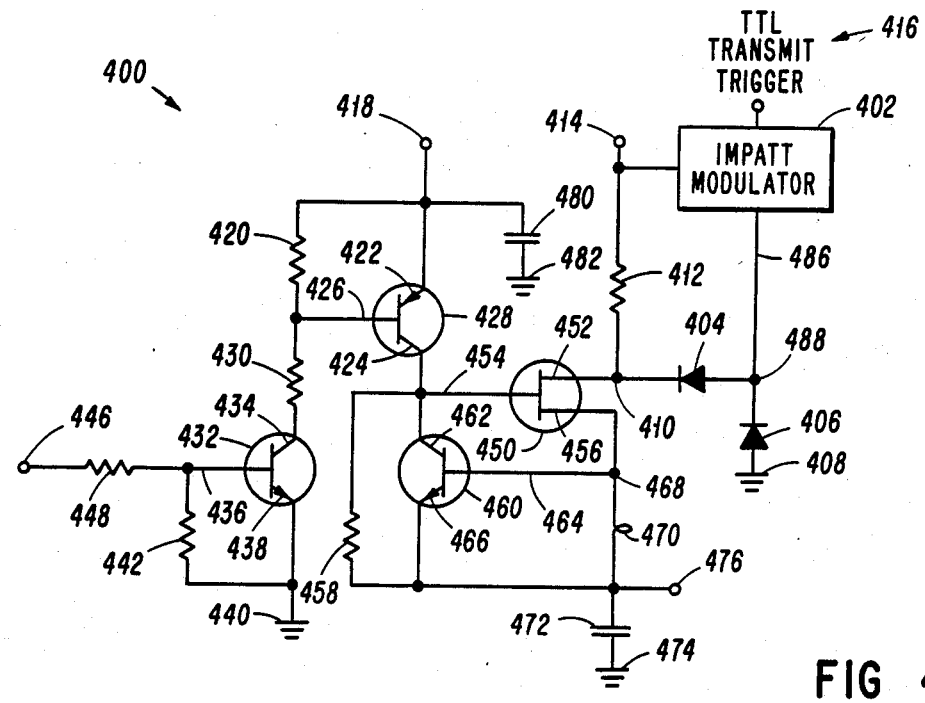
FIG. 4 is a schematic representation of a preferred embodiment of the present invention which utilizes a HEX-FET and a switching diode to apply a high current, low voltage, forward-biased pulse to an IMPATT diode prior to a main RF-producing pulse.

Now referring to FIG. 4, there is shown an RF pulse-producing system generally designated 400, which comprises an IMPATT modulator 402 coupled with leads 414 and 416 together with lead 486 in connection with junction 488, which is coupled to an IMPATT diode 406 and then to ground 408. Junction 488 further is coupled to isolation switching diode 404 through to junction 410. HEX FETs, or any other semiconductor switch capable of large currents, typically have a large capacitance between their output terminals. The FETs in this implementation typically exhibit greater than 1500 pf of capacitance between drain and source. If the FET switch were placed directly across the IMPATT this capacitance would typically provide enough charge storage to cause burn-out problems in the IMPATT diode when pulsed into avalanche. Junction 410 is coupled with lead 414 through resistor 412. Junction 410 is further coupled with the drain 432 of HEX-FET 450 having source 456 connecting through junction 468 and winding 470 to lead 476 and through capacitor 472 to ground 474. Junction 468 is coupled with the base 464 of the NPN transistor 460 having its emitter coupled with lead 476. Resistor 458 separating emitter 466 and collector 462 of transistor 460 and thereby coupled to the drain 453 of HEX-FET 450. Collector 462 of transistor 460 is coupled with collector 424 of PNP transistor 428 whose base 426 is separated from its emitter 422 by resistor 420. Resistor 420 and emitter 422 are coupled with lead 418 which is grounded through capacitor 480. Base 426 of PNP transistor 428 which is coupled with resistor 420 is coupled with collector 434 of NPN transistor 432 through resistor 430. Emitter 438 of transistor 432 is separated from its base 436 by resistor 442. Both resistor 442 and emitter 438 are coupled with ground 440. Base 436 of transistor 432 is coupled to lead 446 through resistor 448.

While not wishing to be bound by any particular theory or set of design or performance parameters the following typical operation is discussed. The IMPATT modulator was a standard, pulsed, constant-current source running off a voltage source, typically 80 volts, and triggered with a TTL logic signal. This modulator is typically capable of up to two amps of pulsed current.

The positive-bias preheat pulse is applied with a pulsed constant-current source implemented with a standard HEX-FET and it is also triggered with a TTL logic pulse. The timing sequence is initiated by first applying the preheat pulse. This is typically followed by a 5 usec void to allow switch transients to settle and then a transmit pulse is applied to the IMPATT modulator to produce the desired microwave rf burst.

The constant-current source for the preheat function typically provides a fixed 35 amp pulse for this particular implementation. Typically, the voltage drop across the IMPATT with this forward current is approximately 1.8 volts. The preheat thus supplies a pulsed power of approximately 63 watts to the diode which is comparable to the input power when in the avalanche mode.

Preheat pulsewidths are varied automatically with temperature using a microprocessor. Temperature data was supplied by a thermocycle mounted on the IMPATT chassis. A typical system, tuned at 75° C., might use no preheat above room temperature, 5 microseconds of preheat at room temperature, 15 microseconds of preheat at $-25°$ C., and 35 microseconds of preheat at $-55°$ C.

During preheat the switching diode 404 is on and the full heating current flows through the device. During transmit, however, the switching diode is off since its cathode end is tied to the supply and the voltage on the IMPATT diode never exceeds 70 volts. In the off state the switching diode exhibits approximately 30 pf of capacitance thus providing adequate isolation between the IMPATT bias line and the FET output.

Figure 5:
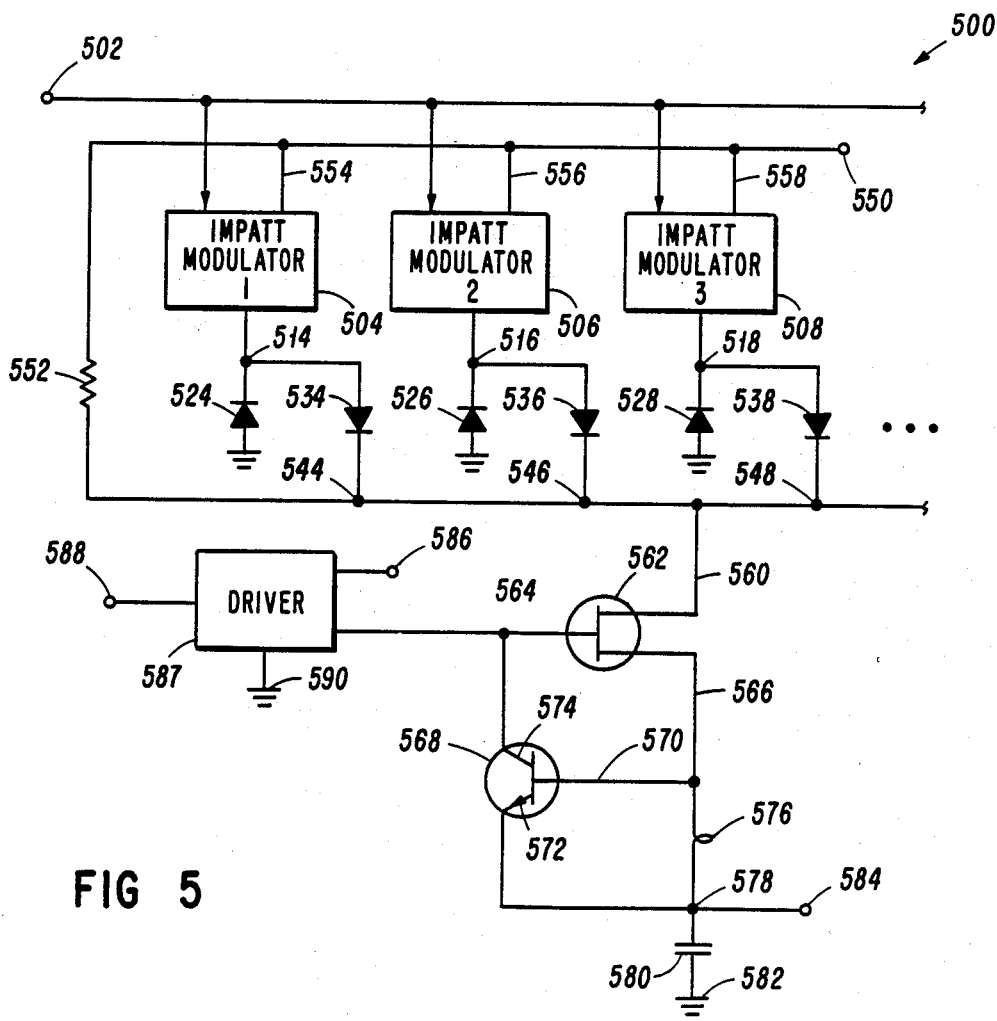
FIG. 5 is a schematic representation of a preferred embodiment of the present invention of FIG. 4 which utilizes a single preheat current source to service a multiple of IMPATT diodes.

Now referring to FIG. 5, there is shown a circuit, generally designated 500, comprising a TTL transmit trigger lead 502 coupled with IMPATT modulators 504, 506 and 508 which have input leads 554, 556 and 558, respectively, each connecting with reference lead 550 which is coupled through resistor 552 to the drain 560 of transistor 562. IMPATT modulators 504, 506, 508 further having output leads to junctions 514, 516 and 518, respectively, which are separated from ground by IMPATT diodes 524, 526 and 528, respectively. Junctions 514, 516 and 518 being further coupled with drain 560 of transistor 562 through switching diodes 534, 536, and 538, respectively. Source 566 of transistor 562 coupled with winding 576 to lead 584 and capacitor 580 to ground, and emitter 572 of NPN transistor 568 at junction 578. Source 566 of HEX-FET 562 coupled directly with gate 570 of NPN transistor 568 having its collector 574 coupled with the base 564 of HEX-FET transistor 562 which couples with driver 587 having a ground 590 and a reference lead 586, and an input TTL preheat trigger lead 588.

In operation, the switching diode makes possible the preheat of a multiple IMPATT diode transmitter using a single preheat current source. Here all the IMPATT diodes are preheated from one current source, but are isolated from the current source and each other during transmit since all the switching diodes are in the reverse-bias state in the transmit mode.

It is believed that the present invention and many of its attended advantages will be understood from the foregoing description, and it will be apparent that various changes may be made in the form, construction, and arrangements of the parts thereof without departing from the spirit and scope of the invention or sacrificing all of its material advantages, the form hereinbefore described being merely preferred or exemplary embodiments thereof. It is the intention of the following claims to encompass and include all of such changes.

I claim:

1. A circuit for generating a pulsed RF signal comprising:
   a. means for generating an RF signal;
   b. means for switching the RF signal from an antenna to a load;
   c. means for manipulating said means for switching so that said means for generating an RF signal is able to generate a pulsed RF signal having a plurality of intervals therein during which no RF signal is generated, the pulsed signal emanating from the antenna by switching the RF signal from the antenna to the load, while providing for heating of said means for generating an RF signal during said plurality of intervals.

2. An apparatus for generating a pulsed RF signal comprising:
  a. a first IMPATT diode having a first diode injection signal lead and a RF signal lead;
  b. a first modulator coupled with said first IMPATT for regulating said IMPATT diode;
  c. a second IMPATT diode having a second injection lead and a second RF signal lead;
  d. a second modulator coupled with said second IMPATT diode for regulating said second IMPATT diode;
  e. an injection signal input connecting with said first and said second injection leads;
  f. a phase shifter interposed between said injection signal input and said second injection lead for shifting the phase of the signal on said second injection lead;
  g. logic circuit means for driving said phase shifter and said first modulator and said second modulator; and
  h. a hybrid coupler means coupling said first RF signal lead and said second RF signal lead.

* * * * *